United States Patent
Mühe

(10) Patent No.: US 7,261,774 B2
(45) Date of Patent: Aug. 28, 2007

(54) CRYSTAL-GROWING FURNACE, IN PARTICULAR A VERTICAL BRIDGMAN CRYSTAL-GROWING FURNACE OR A VERTICAL GRADIENT FREEZE CRYSTAL-GROWING FURNACE HAVING A JACKET HEATER AND A METHOD OF REGULATING THE HEAT OUTPUT OF THE JACKET HEATER

(75) Inventor: Andreas Mühe, Hanau (DE)

(73) Assignee: Crystal Growing System GmbH, Hanau (DE)

(*) Notice: Subject to any disclaimer, the term of this patent is extended or adjusted under 35 U.S.C. 154(b) by 70 days.

(21) Appl. No.: 10/650,240

(22) Filed: Aug. 27, 2003

(65) Prior Publication Data

US 2004/0079276 A1    Apr. 29, 2004

(30) Foreign Application Priority Data

Aug. 27, 2002   (DE) ................................ 102 39 104

(51) Int. Cl.
    *C30B 11/00* (2006.01)
(52) U.S. Cl. ............................. 117/81; 117/82; 117/83; 117/225
(58) Field of Classification Search ................. 117/81, 117/82, 83, 225
    See application file for complete search history.

(56) References Cited

U.S. PATENT DOCUMENTS

| | | | |
|---|---|---|---|
| 4,055,457 A | 10/1977 | Swinehart | |
| 4,417,943 A | 11/1983 | Jacques et al. | |
| 5,047,113 A | 9/1991 | Ostrogorsky | |
| 5,196,486 A * | 3/1993 | Stephenson | 525/328.8 |
| 5,248,377 A * | 9/1993 | Ting | 117/39 |
| 5,471,938 A * | 12/1995 | Uchida et al. | 117/74 |
| 6,136,091 A * | 10/2000 | Yamazaki et al. | 117/81 |
| 6,139,627 A * | 10/2000 | Duval et al. | 117/81 |

FOREIGN PATENT DOCUMENTS

DE        2653414        6/1977

\* cited by examiner

*Primary Examiner*—Robert Kunemund
(74) *Attorney, Agent, or Firm*—Needle & Rosenberg, P.C.

(57) ABSTRACT

This invention is based on the problem of achieving the most planar possible phase boundary extending in the horizontal direction between the still molten material and the material that has already crystallized out in a vertical Bridgman crystal-growing furnace or vertical gradient freeze crystal-growing furnace for crystallizing out the semiconductor melt and doing so at a low cost. Therefore, jacket heaters are provided coaxially with the furnace core containing the crucible and measurement devices for determining radial temperature differences in the space between the jacket heaters and the crucible, whereby the heat output of the jacket heaters is adjusted so that the measured temperature differences become zero. Thus, at least in the planes in which the measurement devices are located, radial heat transport is prevented and a phase boundary that is not curved is implemented.

3 Claims, 1 Drawing Sheet

Figure 1:
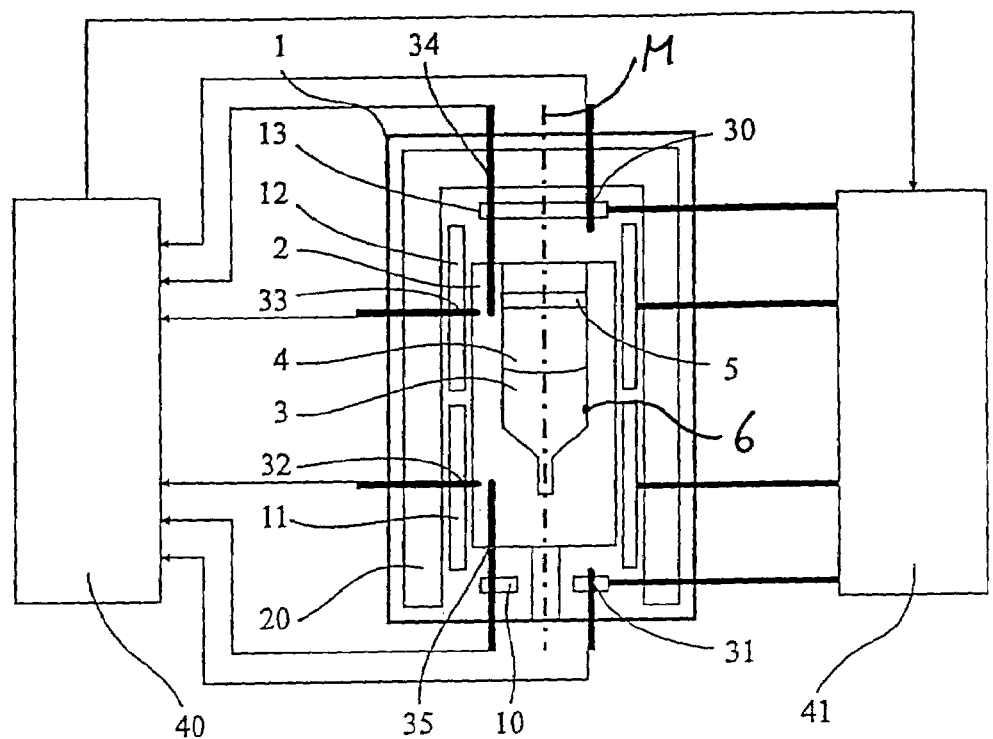

CRYSTAL-GROWING FURNACE, IN PARTICULAR A VERTICAL BRIDGMAN CRYSTAL-GROWING FURNACE OR A VERTICAL GRADIENT FREEZE CRYSTAL-GROWING FURNACE HAVING A JACKET HEATER AND A METHOD OF REGULATING THE HEAT OUTPUT OF THE JACKET HEATER

The present application claims priority to German Patent Application No. 102 39 104.1, filed Aug. 27, 2002, which application is incorporated herein fully by this reference.

This invention relates to a crystal-growing furnace, in particular a vertical Bridgman (VB) crystal-growing furnace or a vertical gradient freeze (VGF) crystal-growing furnace having a jacket heater surrounding the crucible axially and having a device for regulating the heat output of the jacket heater.

Such furnaces are used for the production of single crystals, in particular for the production of single crystals comprising III-V materials, e.g., GaAs or InP.

Known devices for producing single crystals of different materials are usually composed of multi-zone furnaces such as those described in Unexamined German Patent 38 39 97 and U.S. Pat. No. 4,086,424, U.S. Pat. No. 4,423,516, and U.S. Pat. No. 4,518,351.

So-called multi-zone furnaces allow variable establishment of a temperature field suitable for growing crystals and allow it to be shifted along the axis of rotation of the furnace.

However, such devices are characterized by an axial heat flow as well as a radial heat flow, which may result in a variable growth rate and an unfavorable shape of the phase boundary surface between the melt and crystal phases.

In addition, multi-zone furnaces are composed of a plurality of thermal components, thus requiring a great deal of effort in assembly and dismantling of the components for maintenance work. As the number of zones increases, there is also an increase in automation complexity and also in the susceptibility of such multi-zone furnaces to trouble.

In particular for the production of single crystals having a large diameter, e.g., 2", 3", 100 mm, 125 mm, 150 mm, 200 mm, or larger, there is the problem that a radial heat flow in the crystal has an effect on the isotherms, i.e., on the phase boundary between the melt and the single crystal in the vertical and axial directions.

In addition, there are known furnaces for growing crystals (usually semiconductor crystals of compound semiconductors such as GaAs or InP) based on the vertical Bridgman principle or the vertical gradient-freeze crystal growing method. Both methods have in common the fact that the semiconductor material to be crystallized is melted in a crucible made of a material having a high thermal stability, e.g., pyrolytic boron nitride (pBN), thus ensuring a vertical temperature gradient with a decreasing temperature from the top to the bottom and also ensuring that a small monocrystalline seed crystal on the bottom of the crucible, usually placed in a seed channel provided for this purpose, will be only partially melted, not completely melted.

In general, the temperature distribution in the core zone of the furnace is adjusted so that the isotherms of the melting point of the material to be grown will horizontally intersect the area of the melting crucible and thereby define the position of the phase boundary, i.e., the transition of crystalline material below the phase boundary to molten material above the phase boundary. In subsequent gradual cooling of the entire furnace—which is associated with a shift in the vertical temperature profile upward in the case of the vertical gradient freeze and/or a shift downward out of the hot area of the furnace in the case of the vertical Bridgman method when the crucible together with the seed crystal and melt is extracted slowly downward—there is an oriented solidification of the semiconductor material, in which the contact with the monocrystalline seed crystal also initiates monocrystalline growth as the entire batch solidifies.

A single crystal-growing furnace used for this method has a water-cooled vessel, usually pressure tight, an electric heating system, usually consisting of a plurality of individually regulable resistance heating zones, and thermal insulation between the heated core zone of the furnace and the cooled vessel wall. The crucible with the melt and the growing crystal is located in the interior of the heated core zone of the furnace.

A vertical Bridgman crystal-growing furnace also has a mechanical crystal feed, usually driven by an electric motor, with a translational lead-through into the pressurized vessel, which permits the slow lowering of the crystal during its growth. In the vertical Bridgman method the gradual lowering of the crucible in the vertical temperature profile of the stationary furnace by itself constitutes the entire process management, but in the vertical gradient freeze method, neither the furnace nor the crucible moves at all, and crystallization is achieved instead by a defined gradual reduction in the temperatures of the individual heating zones while maintaining the vertical temperature gradient. In both types of furnaces, thermal regulation of the individual heating zones is usually implemented, with thermocouples or pyrometers detecting the temperatures at the most suitable measurement points in the area of the respective heating zone.

For growing crystals according to one of the methods described above, all that is necessary is a vertical temperature gradient in the core zone of the furnace to define the phase transition between the melt and the crystal. This vertical temperature gradient is always associated with a vertical heat flow from top to bottom through the melt and the crystal. In the ideal case of a strictly vertical heat flow through the entire cross-sectional area of the crystal, all the isotherms and thus also the phase boundary would be horizontal planes. In such an ideal case, there must not be any radial heat flow. This could be achieved, e.g., by an ideal thermal insulation, which surrounds the lateral surface of the crucible and does not allow any radial heat flow. However, since there is no such ideal thermal insulation, there are always radial components of the heat flow, so the isotherms in the area of the melt and the crystal are curved and therefore the phase boundary is not planar.

Mechanical stresses in the growing crystal are associated with curvature of the isotherms, which is known to be the most important cause of crystal defects such as dislocations. Therefore, for the technology of growing high quality crystals without dislocations, the object is to minimize mechanical stresses in the crystal and therefore the deviation from ideal, purely vertical heat flow.

One approach for achieving this goal is to compensate for the heat losses due to non-ideal thermal insulation surrounding the core zone of the furnace by providing one or more jacket heaters inside of this insulation, forming one or more heating zones.

In the case of a plurality of heating zones, the temperatures of the jacket heaters are usually regulated so that the temperatures at the individual regulation points arranged vertically one above the other coincide with the vertical temperature profile desired at the particular point in time of crystal growth. However, for reasons of economic feasibility and reliability of the furnace, the goal is usually to minimize the number of heating zones. Therefore, the adaptation of the temperatures of the jacket heaters to the desired vertical temperature profile becomes less and less accurate.

German Patent 199 12 484, which discloses an approach whereby only a single jacket heater is used while nevertheless achieving a strictly axial heat flow in the core area of the furnace, constitutes the generic related art. An additional thermal insulator is introduced inside the jacket heater, thereby largely suppressing any radial heat flow, even in places where there are radial temperature differences between the core zone and the jacket heater. Therefore, this process is relatively insensitive to variations in the temperature of the jacket heater. On the other hand, the optimum heater temperature for a particular point in time in growing a crystal can be determined only indirectly, e.g., by numeric simulation of the heat transport in the furnace.

The object of this invention is thus to provide a simple device for producing single crystals whereby almost exclusively axial heat flow is always ensured.

The present invention achieves this object by providing a hollow cylindrical body made of a heat conducting material as a heat bridge between the crucible and the jacket heater; at least two thermocouples for measuring a radial temperature difference are provided in at least one horizontal plane, radially offset in relation to one another, with the plane intersecting the jacket heater and the crucible, and the heat output of the jacket heater being regulated as a function of the temperature difference.

Since the heat output is regulated so that the temperature difference approaches zero, it is possible to largely suppress a radial heat flow in the core zone of a vertical Bridgman crystal-growing furnace or a vertical gradient freeze crystal-growing furnace.

A radial temperature difference is an indication of an unwanted radial heat flow component in a heating zone. This radial heat component can be eliminated by having a heat flow which acts in the opposite direction and emanates from the jacket heater assigned to the heating zone to precisely compensate for the heat flow emanating from the core zone; this is discernible by a temperature difference approaching zero. Therefore, if the heat output of the jacket heater within which the pair of thermocouples is situated is regulated so that the radial temperature difference remains equal to zero at any point in time, then a radial heat flow is always suppressed without requiring that the jacket heater be regulated at a known absolute temperature from the beginning.

The subordinate claims in the present patent application characterize advantageous embodiments of the present invention. Thus, the thermal sensors are preferably thermocouples, which are arranged in bores in the hollow cylindrical body.

A measured quantity, which indicates the temperature difference, is easily obtained by connecting the thermocouples of a pair of thermocouples electrically back to back, so that the differential voltage forms a measure of the temperature difference.

This invention also relates to a method of regulating the heat output of a jacket heater, which surrounds the cylindrical core zone of a crystal-growing furnace, in particular a vertical Bridgman furnace or a vertical gradient freeze crystal-growing furnace.

To achieve the result that there is no radial heat flow, the heat output is adjusted so that the temperature of the jacket heater is regulated at the temperature at a selected point on the central axis of the crucible.

Since this temperature cannot usually be determined directly, the present invention provides for the temperature difference between two offset radially points in a horizontal plane intersecting the jacket heater and the crucible, these points being inside the jacket heater itself, and adjusting the temperature difference thus determined to zero by appropriate regulation of the heat output of the jacket heater.

When a plurality of heating zones is provided, these zones being arranged one above the other, each being defined by a jacket heater, the heating zones are regulated by a multivariable regulator in such a way as to minimize the sum of the square of the deviation of the temperature differences from zero.

By regulating the jacket heating zones of a vertical Bridgman crystal-growing furnace or a vertical gradient crystal-growing furnace to adjust the respective radial temperature difference in the jacket heating zones to zero, the goal of a strictly axial heat flow in the core zone of the furnace is achieved directly without having to calculate in advance a program for the entire time profile of the heating temperatures.

In addition, the necessity of measuring extremely high absolute temperatures, which is difficult technically, is replaced here by the simpler task of simply measuring the temperature difference. Finally, with the present invention, the jacket heating zones and their regulation become a completely independent unit, which need not be taken into account in the crystal growing program. This reduces the crystal growing program to specification of the chronological course of the temperatures at the upper and lower edges of the core zone of the furnace.

Figure 2:
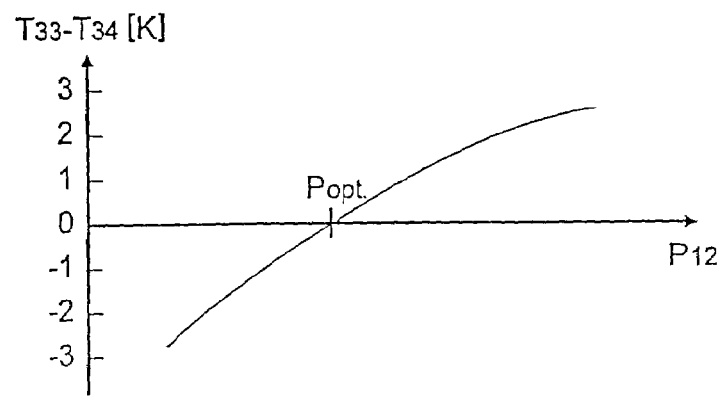

This invention is explained in greater detail below on the basis of one exemplary embodiment, where the figures show:

FIG. 1 a schematic cross-sectional view of the device according to this invention having an axis of rotation M extending vertically, and FIG. 2 a diagram to illustrate the relationship between the heat output and the measured temperature difference.

FIG. 1 shows an example of a vertical gradient freeze crystal-growing furnace in which a hollow body 2 made of a high-temperature resistant material having a moderate thermal conductivity is situated within a vessel 1 and contains the crucible 6 with the growing crystal 3, the semiconductor melt 4 and a covering melt 5. The furnace is designed essentially to have rotational symmetry relative to a vertical axis of rotation M.

A bottom heater 10 is situated beneath the core zone of the furnace, and a top heater 13 is situated above the core zone. The core zone is surrounded by jacket heaters 11 and 12, which are separated from the water-cooled vessel 1 by thermal insulation 20. In a conventional vertical gradient freeze crystal-growing furnace, all the heaters are thermally regulated. To do so, the thermal stresses are detected in a control unit 40 by means of regulating thermocouples 30, 31, 32, 33 and the manipulated variables of the individual heat outputs are calculated. Then the control unit 40 preselects the setpoint values for the heat output supplied by an electric power supply 41. During the process, the setpoint values for the individual heating temperatures are taken from a precalculated process program at a certain point in time during crystal growth.

To crystallize the melt, the bottom heater 10 and the top heater 13 are controlled in such a way that the top heater 13 is kept at approximately the melting point of the raw material to be processed, and the bottom heater 10 is first brought to a lower temperature. Then the temperature of the bottom heater 10 is lowered continuously during the crystal growth process in relation to the temperature of the top heater 13, so that the melt in the crucible 6 can solidify continuously from bottom to top, in which case the phase boundary between the material that has already crystallized out and the molten material should run horizontally, i.e., perpendicular to the axis of rotation M.

According to the present invention, the regulating thermocouples 32 and 33 for the jacket heaters 11 and 12 are positioned in vertical boreholes in hollow body 2 in the core zone of the furnace, which consists of, for example, graphite of an average thermal conductivity between 10 w/mK and 50 w/mK. In addition to these thermocouples, additional thermocouples 34 and 35 are positioned in two horizontal boreholes in the hollow body 2 so that they are each offset radially toward the inside by a distance on the order of a few centimeters in relation to the thermocouples 32, 33 mentioned first. Each thermocouple 32, 33 positioned on the outside radially forms a pair with a thermocouple 34, 35 situated in the same plane but on the inside radially. The plane in which the particular pair of thermocouples is situated is preferably located at approximately half the height of each wall heater 11, 12, so that an average temperature difference for the particular heating zone is determined.

The thermal stresses of the thermocouples 32, 35; 33, 34 may either be entered individually by the corresponding components of the control unit 40 and then the temperature differences between the thermocouples of a pair 32, 35 and/or 33, 34 may then be calculated or the thermocouples 32, 35; 33, 34 may be connected back to back in pairs, so that when the temperatures of the thermocouples 33 and 34 belonging to the lower jacket heater 11 and the thermocouples 32 and 35 belonging to the upper jacket heater 12 are the same, this yields a total voltage of zero.

For example, if the heat output of the upper jacket heater 12 is increased at any desired time during crystal growth to a level at which the heating temperature is much higher than the temperature on a midpoint of the furnace axis M within the jacket heater 12, then the result is an inward directed radial heat flow component within the jacket heater 12 and thus also a positive temperature difference between the upper thermocouples 33, 34. This is illustrated by the diagram in FIG. 2.

If at any desired point in time during growth of the crystal, the heat output of the upper jacket heater 12 is reduced to a level at which the heating temperature is significantly lower than the temperature at the selected point on the furnace axis M within the jacket heater 12, then an outward directed radial heat flow component occurs within the jacket heater 12 and thus there is a negative temperature difference between the upper thermocouples 33, 34.

This correlation between the heat output $P_{12}$ of the jacket heater 12 and the temperature difference $T_{33}-T_{34}$ between the upper thermocouples 33, 34 is used to regulate the heat output $P_{12}$, whereby the setpoint value for the temperature difference $T_{33}-T_{34}$ is set at zero. Therefore, at any point in time during growth of the crystal, the optimum heat output $P_{opt}$ of the jacket heater 12 is established, such that the radial heat flow component in the environment of thermocouples 33, 34 disappears. In a completely similar manner, the heat output of the jacket heater 11 is regulated based on the temperature difference between the lower thermocouples 32 and 35.

This invention may essentially be used for any regulation of heat output in a high-temperature furnace for growing crystals in which the goal is to have a space component of the heat flow become zero locally. However, this requires the availability of one heater (and thus one degree of freedom) whose absolute temperature does not have any other significance for the process. In the case of Czochralski crystal growth, this could be, for example, an additional heater in the crystal environment with the help of which a certain temperature profile is established in the crystal for optimization of the point defect balance.

| List of Reference Notation | |
|---|---|
| 1 | vessel |
| 2 | hollow body |
| 3 | crystal |
| 4 | semiconductor melt |
| 5 | cover melt |
| 6 | crucible |
| 10 | bottom heater |
| 11 | lower jacket heater |
| 12 | upper jacket heater |
| 13 | top heater |
| 20 | thermal insulation |
| 30 | thermocouple (top) |
| 31 | thermocouple (bottom) |
| 32 | thermocouple (lower, outside) |
| 33 | thermocouple (upper, outside) |
| 34 | thermocouple (upper, inside) |
| 35 | thermocouple (lower, inside) |
| 40 | control unit |
| 41 | power supply |

The invention claimed is:

1. The method of regulating the heat output of a jacket heater, characterized in that the temperature difference between two radially offset points within the jacket heater in a horizontal plane intersecting the jacket heater and the crucible is determined, and the temperature difference thus determined is adjusted to zero by a corresponding regulation of the heat output of the jacket heater.

2. The method of regulating the heat output of a jacket heater according to claim 1, characterized in that the crystal-growing furnace is provided with a plurality of heating zones situated one above the other, each defined by a jacket heater, and the regulation of the heat output of the jacket heaters of the individual heating zones is performed by a multi-variable regulator so that the sum of the squares of the deviation of the temperature differences prevailing in the particular heating zone is minimal.

3. The method of regulating the heat output of a jacket heater according to claim 1 or 2, characterized in that the temperature measurement is performed with thermocouples.

* * * * *